(12) United States Patent
Bagga et al.

(10) Patent No.: US 11,264,960 B2
(45) Date of Patent: Mar. 1, 2022

(54) DIFFERENTIAL CURRENT SOURCE

(71) Applicants: Sunny Bagga, Corona, CA (US); Brian J. Cadwell, Pasadena, MD (US); Shaun Mark Goodwin, East New Market, MD (US); Scott F. Allwine, Leesburg, VA (US)

(72) Inventors: Sunny Bagga, Corona, CA (US); Brian J. Cadwell, Pasadena, MD (US); Shaun Mark Goodwin, East New Market, MD (US); Scott F. Allwine, Leesburg, VA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/847,017

(22) Filed: Apr. 13, 2020

(65) Prior Publication Data

US 2021/0320633 A1  Oct. 14, 2021

(51) Int. Cl.
*H03F 3/45* (2006.01)
*G01R 31/28* (2006.01)

(52) U.S. Cl.
CPC ......... *H03F 3/45076* (2013.01); *G01R 31/28* (2013.01); *H03F 2200/372* (2013.01); *H03F 2203/45101* (2013.01); *H03F 2203/45134* (2013.01)

(58) Field of Classification Search
CPC ....... H03F 3/45076; H03F 2203/45134; H03F 2200/372; H03F 2203/45101; G01R 31/28

USPC .................................................. 330/252–261
See application file for complete search history.

(56) References Cited

U.S. PATENT DOCUMENTS

| | | | |
|---|---|---|---|
| 4,528,495 A | | 7/1985 | Dorsman |
| 4,764,752 A | * | 8/1988 | Ormond .................. H03M 1/10 327/307 |
| 5,021,729 A | | 6/1991 | Sutton |
| 5,101,599 A | | 4/1992 | Takabayasi et al. |
| 6,259,322 B1 | | 7/2001 | Muza |

\* cited by examiner

*Primary Examiner* — Hieu P Nguyen
(74) *Attorney, Agent, or Firm* — Tarolli, Sundheim, Covell & Tummino LLP

(57) ABSTRACT

A current source circuit can include a first amplifier circuit and a second amplifier circuit. Each of the first and second amplifier circuits can be configured to generate respective amplifier output voltages based on a corresponding input voltage and respective feedback voltage. The current source circuit can further include a cross-coupling circuit that can include a first set of resistors and a second set of resistors. The first set of resistors can be configured to establish a first cross-coupling voltage based on the first amplifier output voltage and the second set of resistors can be configured to establish a second cross-coupling voltage based on the second amplifier output voltage. The first and second amplifier circuits can be configured to maintain the first and second cross-coupling voltage at a given voltage amplitude to provide a constant current at an output node of the current source circuit.

20 Claims, 5 Drawing Sheets

DIFFERENTIAL CURRENT SOURCE

GOVERNMENT INTEREST

The invention was made under Government Contract. Therefore, the US Government has rights to the invention as specified in that contract.

TECHNICAL FIELD

The present disclosure relates to a current source. More particularly, the present disclosure relates to a differential current source.

BACKGROUND

A current source is an electronic circuit that delivers or absorbs an electric current which is independent of the voltage across the current source. A constant-current source circuit can generate a current that is relatively stable against variations of power supply voltage. Constant current sources are used in various applications to provide a constant current, such as device under testing (DUT) applications to verify characteristics or a performance of a DUT.

SUMMARY

In an example, a current source circuit can include a first amplifier circuit that can be configured to generate a first amplifier output voltage based on a first input voltage and a first feedback voltage. The first feedback voltage can be generated based on a portion of the first amplifier output voltage and a portion of a second feedback voltage. The current source circuit can further include a second amplifier circuit that can be configured to generate a second amplifier output voltage based on a second input voltage and the second feedback voltage. The second feedback voltage can be generated based on a portion of the second amplifier output voltage and a portion of the first feedback voltage. The current source circuit can further include a cross-coupling circuit that can include a first set of resistors and a second set of resistors. The first set of resistors can be configured to establish a first cross-coupling voltage based on the first amplifier output voltage and the second set of resistors can be configured to establish a second cross-coupling voltage based on the second amplifier output voltage. The first and second amplifier circuits can be configured to maintain the first and second cross-coupling voltage at a given voltage amplitude to provide a constant current.

In another example, a method can include generating a first input voltage having a first voltage amplitude and generating a second input voltage that can have a second voltage amplitude that can be opposite of the first voltage amplitude. The method can further include generating at a first amplifier circuit a first amplifier output voltage based on the first input voltage and a first feedback voltage. The first feedback voltage can be provided based on a portion of the first amplifier output voltage and a portion of a second feedback voltage. The method can further include generating at a second amplifier circuit a second amplifier output voltage based on the second input voltage and the second feedback voltage. The second feedback voltage can be generated based on a portion of the second amplifier output voltage and a portion of the first feedback voltage. The method can further include causing a cross-coupling circuit to provide a differential current based on the first and second amplifier output voltages.

In a further example, a differential current source circuit can include a first amplifier that can be configured to generate a first amplifier output voltage based on a first input voltage and a first feedback voltage. The first feedback voltage can be generated based on a portion of the first amplifier output voltage and a portion of a second feedback voltage. The differential current source circuit can further include a second amplifier that can be configured to generate a second amplifier output voltage based on a second input voltage and a second feedback voltage. The second feedback voltage can be generated based on a portion of the second amplifier output voltage and a portion of the first feedback voltage. The differential current source circuit can further include a cross-coupling circuit that can include a first set of resistors and a second set of resistors. The first set of resistors can be coupled to the first amplifier and the second set of resistors can be coupled to the second amplifier. The first set of resistors can be configured to establish a first cross-coupling voltage based on the first amplifier output voltage and the second set of resistors can be configured to establish a second cross-coupling voltage based on the second amplifier output voltage. The cross-coupling circuit can be configured to provide a differential current based on the first and second cross-coupling voltages.

DETAILED DESCRIPTION

Figure 1:
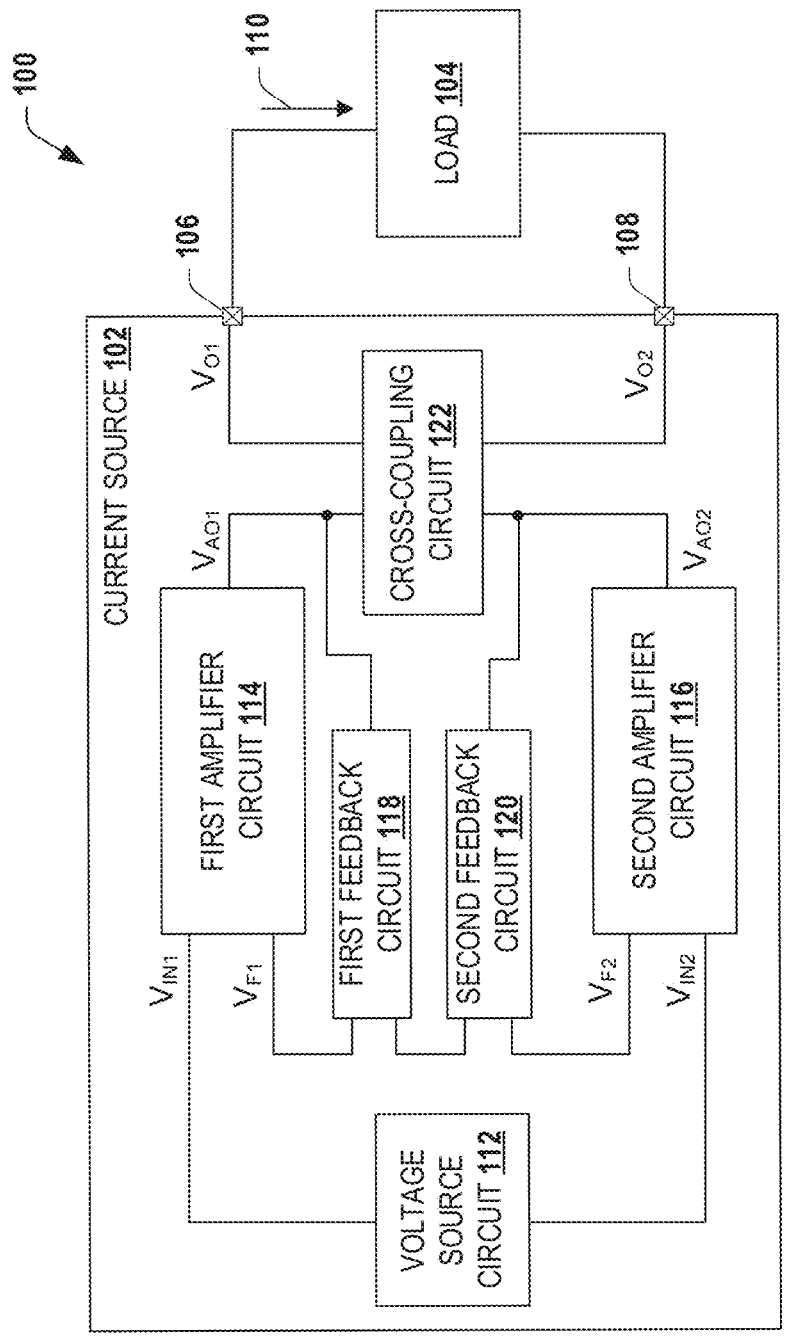
FIG. 1 illustrates an example environment for providing a constant current.

The present disclosure relates to a differential current source. In some examples, such as microelectronic testing, precise low noise output currents (e.g., in a nano-amperes range) may be needed for circuit performance testing. Single-ended current sources employed in such applications are configured such that a load references a ground. Such a configuration can make testing of electronic circuits (e.g., microelectronic circuits) difficult because an output current being provided by the single-ended current source can become contaminated with noise (e.g., disturbances induced from a surrounding environment, other circuitry, etc.). Single-ended current sources employed in device under test (DUT) applications do not allow for accurate testing of DUTs because the noise modifies the output current to levels that can make the output current unusable.

In some examples, a differential current source can be employed to provide a load (e.g., a DUT) a load current having a reduced amount of noise. The load can be coupled to the differential current source, such that the load can float relative to the differential current source. By floating the load relative to the differential current source, the load does not reference a ground (e.g., an earth ground or a local ground). The differential current source can be configured to reduce the amount of noise in the load current and provide a differential output current that has a reduced amount of noise and that is constant during changes at the load (e.g., impedance variations).

In some examples, the differential current source includes first and second amplifier circuits. A first input of each of the first and second amplifier circuits can be coupled to a voltage source circuit to receive a corresponding input voltage. The first input of the first amplifier circuit can be configured to receive a first input voltage and the first input of the second amplifier circuit can be configured to receive a second input voltage from the voltage source circuit. The first and second amplifier circuits can be configured to operate out of phase (e.g., 180 degrees (°) out of phase) with respect to each other. As such, the first and second amplifier circuits can be driven bipolar to produce a differential load current. The first amplifier circuit can be configured to push the load current and the second amplifier circuit can be configured to pull the load current with respect to the load. Because the load is not referencing the ground, the first and second amplifier circuits push-pull the load current relative to the load and reject a common mode noise to provide the load current with a reduced amount of noise. In some examples, the differential current source includes a cross-coupling circuit that can include a first set and a second set of resisters. The first and second amplifier circuits can be configured to maintain first and second cross-coupling voltages across a respective set of resistors of the cross-coupling circuit, such that a current amplitude of the load current does not vary with changes at the load (e.g., impedance changes). Thus, the current source can be configured to provide a constant differential current corresponding to a constant load current.

FIG. 1 illustrates an example environment 100 for providing a constant current. The environment 100 can include a current source 102. The current source 102 can be coupled to a load 104. By way of example, the load 104 is a circuit or a device. The current source 102 can be configured to output a constant current to the load 104 during load variations (e.g., impedance changes, such as resistance at the load 104). Thus, the current source 102 can be configured to provide a current that can have a current amplitude that can be constant over time during impedance changes at the load 104. In some examples, the current is a direct current (DC) current and, in other examples, the current is an alternating current (AC) current.

The current source 102 can include a first node 106 and a second node 108. The load 104 can be coupled to the first and second nodes 106-108, as illustrated in FIG. 1. By coupling the load 104 to the first and second nodes 106-108 a first load current path can be provided between the first node 106 and the load 104 and a second load current path can be provided between the second node 108 and the load 104. The current source 102 can be configured to provide a load current 110 to the first node 106. The first load current path can be employed to provide the load 104 with the load current 110 and the second load current path can be employed to provide a return path for the load current 110 to the current source 102.

In some examples, the current source 102 is configured to push and pull the load current 110 relative to the load 104. The pushing and pulling action of the load current 110 can correspond to operating the current source in a bipolar state. During the bipolar state, the current source 102 can be configured to supply positive and negative load currents. For example to provide the load 104 with a positive load current, the current source 102 is configured to push the positive load current to the first node 106 and receive the positive load current via the second load current path from the load 104 at the second node 108. In some examples to provide the load 104 with a negative load current, the current source 102 is configured to push the negative load current to the second node 108 and receive the negative load current via the first load current path from the load 104 at the first node 106.

The current source 102 is configured output a first output voltage $V_{O1}$ at the first node 106 and a second output voltage $V_{O1}$ at the second node 108. The first and second output voltages $V_{O1}$, $V_{O2}$ can have opposite voltage amplitude, such that a total output voltage across the first and second nodes 106-108 can be about 0 volts (V). For example, if the first output voltage $V_{O1}$ is about 501.5 millivolts (mV) at the first node 106 and the second output voltage $V_{O1}$ is about −501.5 mV at the second node 108, the total output voltage across the first and second nodes 106-108 can be about 0V.

In some examples, the current source 102 includes a voltage source circuit 112. The voltage source circuit 112 can be configured to provide a first input voltage $V_{IN1}$ and a second voltage input $V_{IN2}$. In an example, the first input voltage $V_{IN1}$ has a positive DC amplitude and the second voltage input $V_{IN2}$ has a negative DC amplitude. In other examples, the first and second input voltages $V_{IN1}$, $V_{IN2}$ are respectively first and second AC voltage inputs. In some examples, the voltage source circuit 112 includes a first voltage source circuit and a second voltage source circuit (not shown in FIG. 1). The first voltage source circuit can be configured to provide the first input voltage $V_{IN1}$ and the second voltage source circuit can be configured to provide the second input voltage $V_{IN2}$. Thus, in some examples, the first and second voltage circuits are DC voltage circuits and, in other examples, the first and second voltage circuits are AC voltage circuits.

By way of further example, the current source 102 includes first and second amplifier circuits 114-116. A first input of each of the first and second amplifier circuits 114-116 can be coupled to the voltage source circuit 112 to receive a corresponding input voltage. Thus, the first input of the first amplifier circuit 114 is configured to receive the first input voltage $V_{IN1}$ and the first input of the second amplifier circuit 116 is configured to receive the second input voltage $V_{IN2}$. The first and second amplifier circuits 114-116 can be configured to operate out of phase (e.g., 180° out of phase) with respect to each other. As such, the first and second amplifier circuits 114-116 can be driven bipolar to produce a differential load current corresponding to the load current 110. The first amplifier circuit 114 can be configured to push the load current 110 and the second amplifier circuit 116 can be configured to pull the load current 110 with respect to the load 104. Because the load 104 is coupled to the first and second nodes 106-108 and not referencing a ground, the first and second amplifier circuits 114-116 push-pull the load current 110 relative to the load 104. Because the load 104 does not reference the ground, common mode noise can be rejected by the first and second amplifier circuits 114-116.

In some examples, each of the first and second amplifier circuits 114-116 can be further coupled to a respective first and second feedback circuit 118-120. A second input of each of the first and second amplifier circuits 114-116 can be coupled to a corresponding feedback circuit. Each of the first and second feedback circuits 118-120 can be coupled to a cross-coupling circuit 122. Each of the first and second feedback circuits 118-120 can couple to each other respective second inputs of the first and second amplifier circuits 114-116. As such, the second input of the first amplifier circuit 114 can be configured to receive a first feedback voltage $V_{F1}$ that is based on a portion of a first amplifier output voltage $V_{AO1}$ and a portion of a second feedback voltage $V_{F2}$ at the second input of the second amplifier circuit 116. The second input of the second amplifier circuit 116 is configured to receive the second feedback voltage $V_{F2}$ that is based on a portion of a second amplifier output voltage $V_{AO2}$ and a portion of the first feedback voltage $V_{F1}$ at the second input of the first amplifier circuit 114.

By coupling the second inputs of the first and second amplifier circuits 114-116 to each other, the first and second amplifier circuits 114-116 can be configured to operate out of phase (e.g., 180° out of phase) with respect to each other. Each of the first and second amplifier circuit 114-116 can be configured to reference a corresponding amplifier circuit 114-116. As such, the first and second amplifier circuits 114-116 can float with respect to each other and operate in a differential manner to provide the differential load current corresponding to the load current 110. In response to coupling the load 104 to the first and second nodes 106-108, the load 104 can float (e.g., not be referenced to a ground) relative to the current source 102. Accordingly, the first and second amplifier circuits 114-116 can be driven bipolar based on a respective first and second input voltage $V_{IN1}$, $V_{IN2}$ and further based on a respective first and second feedback voltage $V_{F1}$, $V_{F2}$ to cause the current source 102 to produce the load current 110.

In some examples, each of the first and second amplifier circuits 114-116 can be coupled to the cross-coupling circuit 122. For example, an output of each of the first and second amplifier circuits 114-116 can be coupled to the cross-coupling circuit 122. The cross-coupling circuit 122 can be coupled to the first and second feedback circuits 118-120 and to the first and second nodes 106-108. The cross-coupling circuit 122 can be configured to receive respective first and second amplifier output voltages $V_{AO1}$, $V_{AO2}$. The cross-coupling circuit 122 can be configured to provide respective first and second output voltages $V_{O1}$, $V_{O2}$ at a corresponding output node (e.g., one of the first and second nodes 106-108) based on the first and second amplifier output voltages $V_{AO1}$, $V_{AO2}$. The first and second output voltages $V_{O1}$, $V_{O2}$ can have opposite amplitudes, such that the total output voltage across the first and second nodes 106-108 can be about 0V.

In some examples, the cross-coupling circuit 122 includes a first set of resistor. The cross-coupling circuit 122 further includes a second set of resistor. Each of the resistors in each of the first and second set of resistors can be coupled in series with respect to each other. The first set of resistors can be coupled in parallel with the second set of resistors. In some examples, the cross-coupling circuit 122 includes at least one capacitor to couple the first and second set of resistors in series. The capacitor can introduce a filtering corner in the current source 102, such that the load current 110 has a frequency less than or equal to a cutoff frequency.

In some examples, a first cross-coupling voltage can be established across the first set of resistors based on the first output voltage $V_{O1}$ and the first amplifier output voltage $V_{AO1}$. A second cross-coupling voltage can be established across the second set of resistors based on the second output voltage $V_{O1}$ and the second amplifier output voltage $V_{AO2}$. The first and second amplifier circuits 114-116 can be configured to maintain the first and second cross-coupling voltages across a respective set of resistors based on a corresponding amplifier output voltage and an output voltage at a respective node, such that a current amplitude of the load current 110 does not vary with changes at the load (e.g., impedance changes). Thus, the current source 102 can be configured to provide a constant differential current corresponding to a constant load current.

By way of further example, the current source 102 can be configured to employ the cross-coupling circuit 122 in a negative feedback path for each of the first and second amplifier circuits 114-116. A first negative feedback path can refer to a current path between the first node 106 and the second input of the first amplifier circuit 114. The first negative feedback path can include the first set of resistors of the cross-coupling circuit 122 and the first feedback circuit 118. A second negative feedback path can refer to a current path between the second node 108 and the second input of the second amplifier circuit 116. Thus, the second negative feedback path can include the second set of resistors of the cross-coupling circuit 122 and the second feedback circuit 120.

Because each of the first and second amplifier circuits 114-116 are configured to reference the cross-coupling circuit 122 via a respective first and second negative feedback path, the load current 110 can remain constant, such as during impedance changes at the load 104. Moreover, by coupling the first and second nodes 106-108 to each other via the cross-coupling circuit 122 introduces the cross-coupling circuit 122 into each of the first and second negative feedback paths. Introducing the cross-coupling circuit 122 into the first and second negative feedback paths and coupling the second inputs of the first and second amplifier circuits 114-116 to each other, each of the first and second amplifier circuits 114-116 can reference each other by receiving one of a positive or a negative reference feedback voltage at a respective second input. Thus, for example, the first feedback voltage $V_{F1}$ can have a voltage amplitude that is one of a positive or negative and the second feedback voltage $V_{F2}$ can have an amplitude that is opposite of the feedback voltage $V_{F1}$. For example, if the first feedback voltage $V_{F1}$ is about 750 mV than the second feedback voltage $V_{F2}$ can be about −750 mV. Thus, the load current 110 provided at the first node 106 can be based on the first input voltage $V_{IN1}$ and a resistance of the first set of resistors of the cross-coupling circuit 122. In some examples, if the load current 110 is provided at the second node 108, the load current 110 can be based on the second input voltage $V_{IN2}$ and the resistance of the second set of resistors of the cross-coupling circuit 122.

In some examples, the current source 102 can be configured to output the load current 110 with an amplitude in a given amperes range. In an example, the given amperes range corresponds to a nan-amperes range. Thus, in some examples, the voltage source circuit 112 can be configured to provide first and second input voltages $V_{IN1}$, $V_{IN2}$ with an amplitude that is in the nan-amperes range. As such, the current source 102, in these examples, can be referred to as a nanocurrent source. The current source 102 can be employed in any circuit application to provide an output current that is constant (e.g., does not vary over time in amplitude relative to a voltage value). In some examples, such as microelectronic testing, precise low noise output currents may be needed for circuit performance testing. Single-ended current sources employed in such applications are configured such that a load references a ground. Such a configuration can make testing of electronic circuits (e.g., microelectronic circuits) difficult because the output current being provided by the single-ended current source can become contaminated with noise (e.g., disturbances induced from a surrounding environment, other circuitry, etc.). Single-ended current sources employed in DUT applications do not allow for accurate testing of DUTs because the noise modifies the output current to levels that can make the output current unusable.

By employing the current source 102, the load 104 can receive an output current that can have a reduced amount of noise (e.g., in some examples, no noise), such that electronic circuits (e.g., microelectronic circuits or DUTs) can be effectively tested. Because the first and second output nodes 106-108 can be coupled to the load 104, the load 104 can float (e.g., not be referenced to ground, such a local ground or an earth ground) relative to the current source 102. Thus, the output current can be a differential output current that does not reference the ground and that is free of noise.

Figure 2:
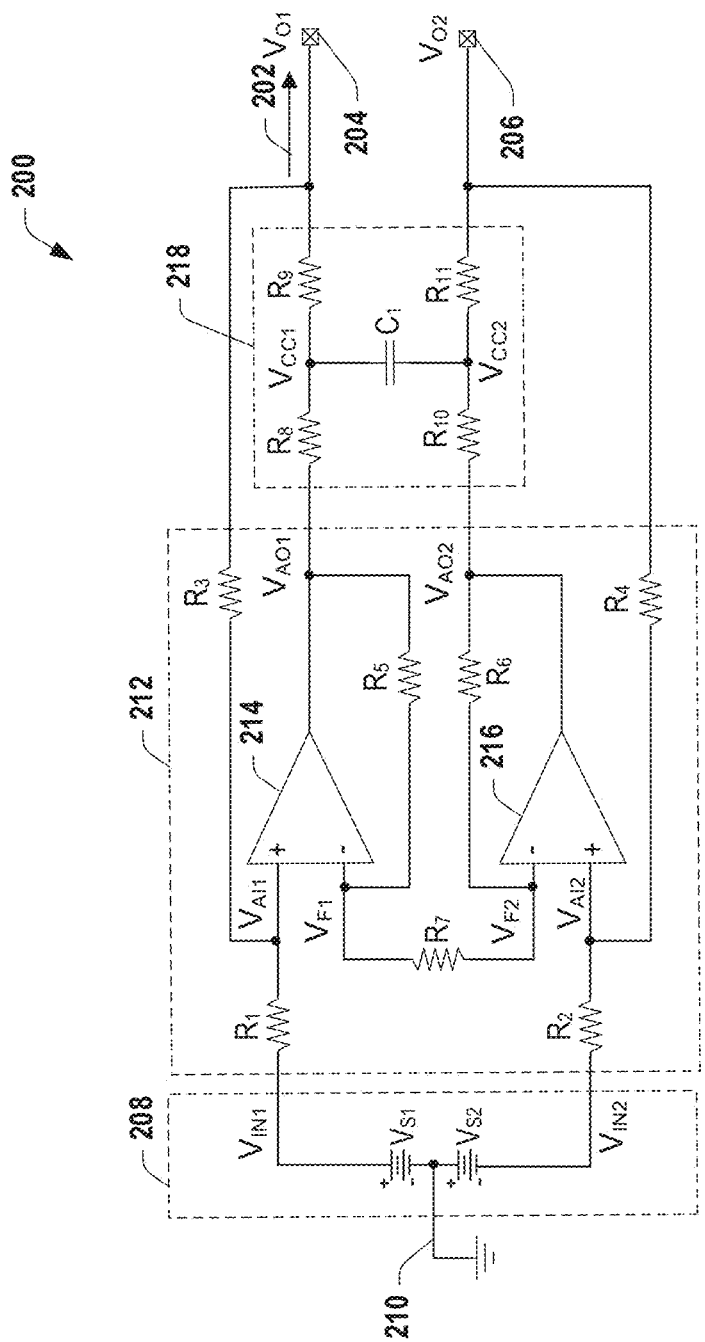
FIG. 2 illustrates an example of a differential current source circuit.

FIG. 2 illustrates an example of a differential current source circuit 200. The differential current source circuit 200, in some examples, can correspond to the current source 102, as illustrated in FIG. 1. The differential current source circuit 200 can be configured to provide a load current 202 to a first node 204 of the differential current source circuit 200. In some examples, the load current 202 can be provided to a second node 206 of the differential current source circuit 200. For example, the differential current source circuit 200 can be configured to push the load current 202 to the first node 204. The first and second nodes 204-206 can be coupled to a load (not shown in FIG. 2). In some examples, the load is the load 104, as illustrated in FIG. 1. Thus, in some examples, the first and second nodes 204-206 correspond to the first and second nodes 106-108, as illustrated in FIG. 1. By coupling the first and second nodes 204-206 to the load a first load current path can be provided between the first node 204 and the load and a second load current path can be provided between the second node 206 and the load. The first load current path can be employed to provide the load current 202 to the load and the second load current path can be employed to provide a return path for the load current 202.

In some examples, the differential current source circuit 200 is configured to push and pull the load current 202 relative to the load. The pushing and pulling action of the load current 202 relative to the load enables the differential current source circuit 200 to operate bipolar, supplying one of a positive or a negative load current from a DC current to a corresponding gain bandwidth product (GBP) of the differential current source circuit 200. For example to provide the load with a positive load current, the differential current source circuit 200 is configured to push the load current 202 to the first node 204 to provide the load current 202 to the load and receive the load current 202 via the second load current path at the second node 206. In some examples to provide the load with a negative load current, the differential current source circuit 200 is configured to push the load current 202 to the second node 206 to provide the load current 202 to the load and receive the load current 202 via the first load current path at the first node 204. In some examples, the load current 202 can correspond to the load current 110, as illustrated in FIG. 1. In some examples, the load current 202 is AC load current and, in other examples, the load current 202 is a DC load current.

The differential current source circuit 200 is configured output a first output voltage $V_{O1}$ at the first node 204 and a second output voltage $V_{O2}$ at the second node 206 having an opposite voltage amplitude, such that a total output voltage based on the output voltages $V_{O1}$ and $V_{O2}$ can be about 0V. For example, if the first output voltage $V_{O1}$ is about 501.5 mV at the first node 204 than the second output voltage $V_{O2}$ is about −501.5 mV at the second node 206. The total output voltage across the first and second nodes 204-206 can be about 0V. The differential current source circuit 200 includes a voltage source circuit 208. The voltage source circuit 208 can include a first voltage source $V_{S1}$ and a second voltage source $V_{S2}$. In some examples, first and second voltage sources $V_{S1}$, $V_{S2}$ are DC voltage sources, as illustrated in FIG. 2. In other examples, the first and second voltage sources $V_{S1}$, $V_{S2}$ are AC voltage sources. The first voltage source $V_{S1}$ can be coupled to the second voltage source $V_{S2}$.

In some examples, respective terminals of the first and second voltage sources $V_{S1}$, $V_{S2}$ can be coupled to a ground 210. The voltage source circuit 208 can be coupled to an amplifier circuit stage 212 of the differential current source circuit 200 via first and second resistors $R_1$ and $R_2$. A first input voltage $V_{IN1}$ can be established by the first voltage source $V_{S1}$ and a second input voltage $V_{IN2}$ can be established by the second voltage source $V_{S2}$. The first input voltage $V_{IN1}$ can have one of a positive or a negative voltage amplitude and the second input voltage $V_{IN2}$ has one of a remaining positive or negative voltage amplitude. For example, if the first input voltage $V_{IN1}$ is about 1V than the second input voltage $V_{IN2}$ is about −1V. In some examples, the first and second input voltages $V_{IN1}$, $V_{IN2}$ correspond to the first and second input voltages $V_{IN1}$, $V_{IN2}$, as illustrated in FIG. 1.

By way of further example, each of the first and second input voltages $V_{IN1}$, $V_{IN2}$ are provided to the amplifier circuit stage 212. The amplifier circuit stage 212 includes a first amplifier 214 and a second amplifier 216. A non-inverting input of the first amplifier 214 (labelled in the example of FIG. 2 with a "+" symbol) can be coupled via the first resistor $R_1$ to the voltage source circuit 208 to receive the first input voltage $V_{IN1}$. A non-inverting input of the second amplifier 216 (labelled in the example of FIG. 2 with a "+" symbol) can be coupled via the second resistor $R_2$ to the voltage source circuit 208 to receive the second input voltage $V_{IN2}$. In further examples, the non-inverting terminal of each of the first and second amplifiers 214-216 can be coupled via a respective third and fourth resistor $R_3$, $R_4$ to a respective output node (e.g., one of the first and second output nodes 204-206) to provide respective first and second positive feedback paths. In an example, the first amplifier 214, the first resistor $R_1$ and the third resistor $R_3$ collectively define the first amplifier circuit 114, as illustrated in FIG. 1. In some examples, the second amplifier 216, the second resistor $R_2$ and the fourth resistor $R_4$ collectively define the second amplifier circuit 116, as illustrated in FIG. 1.

By way of further example, each output of the first and second amplifiers 214-216 can be coupled to a respective fifth and sixth resistor $R_5$ and $R_6$. The fifth resistor $R_5$ can correspond to the first feedback circuit 118 and the sixth resistor $R_6$ can correspond to the second feedback circuit 120, as illustrated in FIG. 1. The respective fifth and sixth resistor $R_5$ and $R_6$ can couple a respective output of the first and second amplifiers 214-216 to an inverting input of a corresponding amplifier 214-216 (illustrated in the example of FIG. 2 with a "−" symbol). A seventh resistor $R_7$ can be employed to couple to each other each of the inverting inputs of first and second amplifiers 214-216. In some examples, the non-inverting input of the first amplifier 214 is configured to receive a first amplifier input voltage $V_{A I1}$ that can be based on the first input voltage $V_{IN1}$ and a portion of the first output voltage $V_{O1}$ at the first node 204. The non-inverting input of the second amplifier 216 is configured to receive a second amplifier input voltage $V_{A I2}$ that is based on the second input voltage $V_{IN2}$ and a portion of the second output voltage $V_{O1}$ at the second node 206.

The inverting input of the first amplifier 214 is configured to receive a first feedback voltage $V_{F1}$ that is based on a portion of a first amplifier output voltage $V_{AO1}$ and a portion of a second feedback voltage $V_{F2}$ at the inverting input of the second amplifier 216. The inverting input of the second amplifier 216 is configured to receive the second feedback voltage $V_{F2}$ that is based on a portion of a second amplifier output voltage $V_{AO2}$ and a portion of the first feedback voltage $V_{FA}$ at the inverting input of the first amplifier 214. By coupling the inverting inputs of the first and second amplifiers 214-216 to each other via the seventh resistor $R_7$, the first and second amplifiers 214-216 can be configured to operate out of phase (e.g., 180° out of phase) with respect to each other. Each first and second amplifier 214-216 can be configured to reference a corresponding amplifier 214-216. As such, the first and second amplifiers 214-216 can float with respect to each other and operate in a differential manner. In response to coupling the load to the first and second nodes 204-206, the load can float (e.g., not be referenced to the ground 210) relative to the differential current source circuit 200. Accordingly, the first and second amplifiers 214-216 can be driven bipolar based on a respective first and second amplifier input voltage $V_{AI1}$, $V_{AI2}$ and further based on a respective first and second feedback voltage $V_{F1}$, $V_{F2}$ to cause the differential current source circuit 200 to produce the load current 202. In some examples, the first and second feedback voltages $V_{F1}$, $V_{F2}$ can correspond to the first and second feedback voltages $V_{F1}$, $V_{F2}$, as illustrated in FIG. 1.

In some examples, each of the first and second amplifiers 214-216 can further be coupled to a feedback cross-coupling circuit 218. The feedback cross-coupling circuit 218 can correspond to the cross-coupling circuit 122, as illustrated in FIG. 1. For example, the output of each of the first and second amplifiers 214-216 can be coupled to the feedback cross-coupling circuit 218. The feedback cross-coupling circuit 218 can be coupled to the fifth resistor $R_5$ and to the sixth resistor $R_6$. The feedback cross-coupling circuit 218 can further be coupled to each of the first and second output nodes 204-206 and thereby to each of the third and fourth resistors $R_3$, $R_4$ of the amplifier circuit stage 212.

The feedback cross-coupling circuit 218 can be configured to receive respective first and second amplifier output voltages $V_{AO1}$, $V_{AO2}$. The feedback cross-coupling circuit 218 can be configured to provide respective first and second output voltages $V_{AO1}$, $V_{AO2}$ at a corresponding output node (e.g., one of the first and second nodes 204-206) based on the first and second amplifier output voltages $V_{AO1}$, $V_{AO2}$. The first and second output voltages $V_{O1}$, $V_{O2}$ can have opposite amplitudes, such that a total output voltage across the first and second nodes 204-206 can be about 0V.

In some examples, the feedback cross-coupling circuit 218 includes a first set of resistor that includes an eighth resistor $R_8$ and a ninth resistor $R_9$. The feedback cross-coupling circuit 218 further includes a second set of resistor that includes a tenth resistor $R_{10}$ and an eleventh resistor $R_{11}$. Each of the resistors in each of the first and second set of resistors can be coupled in series with respect to each other. The first set of resistors can be coupled in parallel with the second set of resistors. In some examples, the feedback cross-coupling circuit 218 employs a capacitor $C_1$ to couple the first and second set of resistors. The capacitor $C_1$ can introduce a filtering corner in the differential current source circuit 200, such that the load current 202 has a frequency less than or equal to a cutoff frequency.

In some examples, a first cross-coupling voltage $V_{CC1}$ can be established across the first set of resistors $R_8$, $R_9$ based on the first output voltage $V_{O1}$ and the first amplifier output voltage $V_{AO1}$. A second cross-coupling voltage $V_{CC2}$ can be established across the second set of resistors $R_{10}$, $R_{11}$ based on the second output voltage $V_{O2}$ and the second amplifier output voltage $V_{AO2}$. The first and second amplifiers 214-216 can be configured to maintain the first and second cross-coupling voltages $V_{CC1}$, $V_{CC2}$ across a respective set of resistors based on corresponding amplifier output voltages and output voltages at a respective node, such that a current amplitude of the load current 202 does not vary with changes at the load (e.g., impedance changes). Thus, the differential current source circuit 200 can be configured to provide a constant load current for the load.

The differential current source circuit 200 can be configured to employ the feedback cross-coupling circuit 216 in a negative feedback path for each of the first and second amplifiers 214-216. A first negative feedback path with respect to FIG. 2 can refer to a current path between the first node 204 and the inverting input of the first amplifier 214. Thus, the first negative feedback path can include the first set of resistors $R_8$, $R_9$ of the feedback cross-coupling circuit 218 and the fifth resistor $R_5$. A second negative feedback path with respect to FIG. 2 can refer to a current path between the second node 206 and the inverting input of the second amplifier 216. Thus, the second negative feedback path can include the second set of resistors $R_{10}$, $R_{11}$ of the feedback cross-coupling circuit 218 and the sixth resistor $R_6$. Because each of the first and second amplifiers 214-216 are configured to reference the feedback cross-coupling circuit 120 in a corresponding negative feedback path, the load current 202 can remain constant. Thus, the load current 202 can be provided at the first node 204 that can be based on the first amplifier input voltage $V_{AI1}$ and a resistance of the first set of resistors $R_8$, $R_9$ of the feedback cross-coupling circuit 218. In some examples, the load current 202 provided at the second node can be based on the second amplifier input voltage $V_{AI2}$ and the resistance of the second set of resistors $R_{10}$, $R_{11}$ of the feedback cross-coupling circuit 218.

For example, the first amplifier 214 can be configured to push the load current 202 based on the first amplifier input voltage $V_{AI1}$ and the resistance of the first set of resistors $R_8$, $R_9$ and the second amplifier 216 can be configured to pull the load current 202 based on the second amplifier input voltage $V_{AI2}$ and the resistance of the second set of resistors $R_{10}$, $R_{11}$ of the feedback cross-coupling circuit 218. Because the first and second amplifiers 214-216 are configured to operate out of phase with respect to each other, the first and second amplifiers 214-216 push-pull the load current 202 to the first and second nodes 204-206 for the load. The first and second amplifiers 214-216 can be configured to maintain the first and second cross-coupling voltages $V_{CC1}$, $V_{CC2}$, such that the load current 202 is constant. By coupling the first and second nodes 204-206 to each other via the feedback cross-coupling circuit 218 introduces the feedback cross-coupling circuit 218 into each of the first and second negative feedback paths. Introducing the feedback cross-coupling circuit 218 into the first and second feedback paths and coupling the inverting inputs of the first and second amplifiers 214-216 to each other via the seventh resistor $R_7$, each of the first and second amplifiers 214-216 can reference each other by receiving one of a positive or a negative reference feedback voltage $V_{F1}$, $V_{F2}$ at a respective inverting input. Thus, for example, the feedback voltage $V_{F1}$ can have a voltage amplitude that is one of a positive or negative and the feedback voltage $V_{F2}$ can have an amplitude that is opposite of the feedback voltage $V_{F1}$. By way of further example, if the feedback voltage $V_{F1}$ is about 750 mV than the feedback voltage $V_{F2}$ can be about −750 mV.

Because the first and second amplifiers 214-216 reference each other, noise on a given amplifier can appear on another amplifier, such that the noise can be cancelled. In some examples, the first and second amplifiers 214-216 have a high common-mode rejection ratio (CMRR) (e.g., about 120 decibels (dB)). In these examples, the first and second amplifiers 214-216 can be referred to as differential amplifiers. By employing the differential current source circuit 200, the load can be provided with the load current 202 that has a reduced amount of noise. In some examples, such as circuit testing, a low nano-amperes current may be needed to verify a performance (e.g., test) of a DUT. The differential current source circuit 200 can be employed to provide the load current 202 in the nano-amperes range having a reduced amount of noise and thus enable accurate testing of the DUT.

Figure 3:
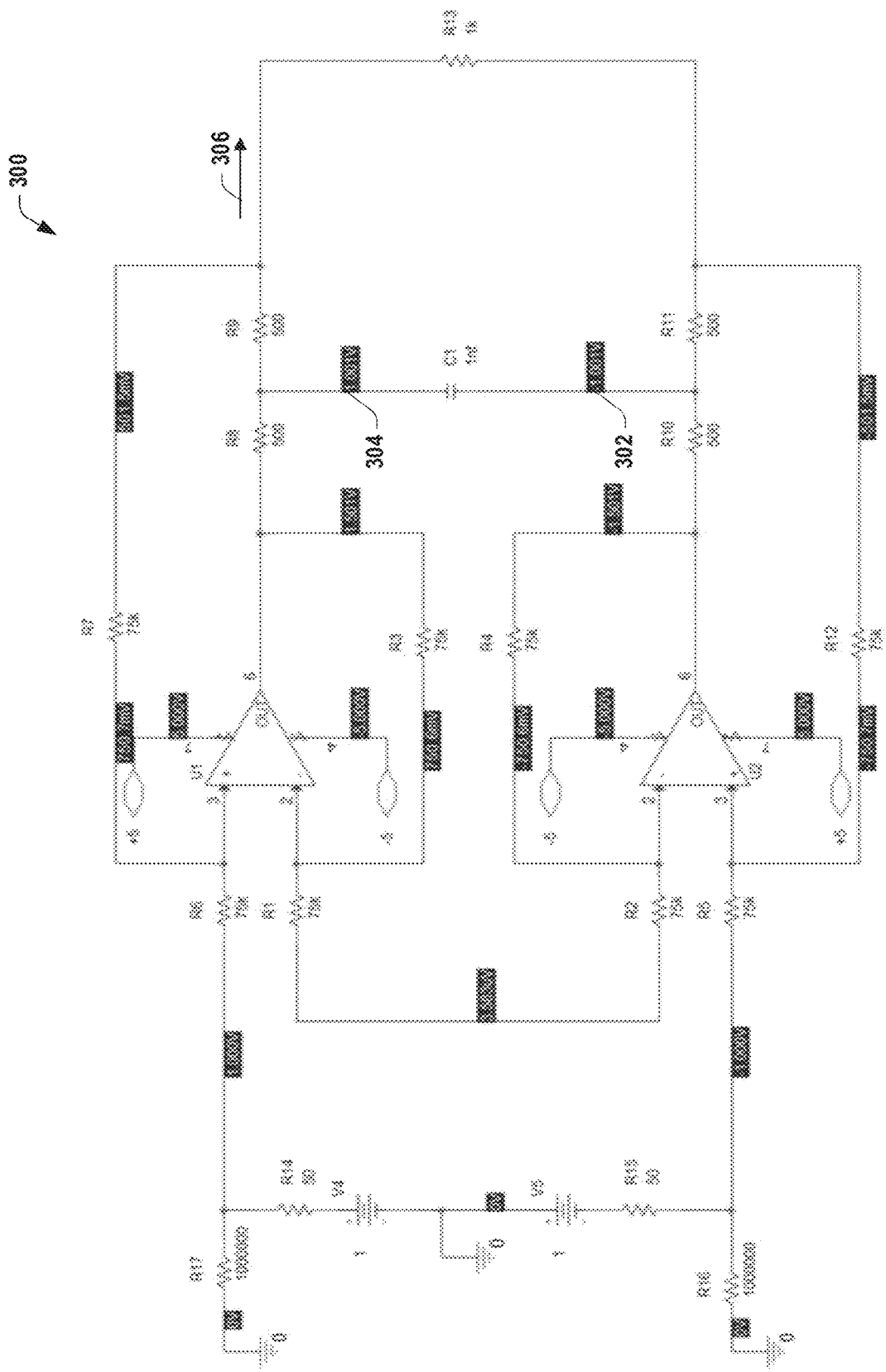
FIG. 3 illustrates an example of a current source circuit.

FIG. 3 illustrates an example of a current source circuit 300. In some examples, the current source circuit 300 can correspond to the current source 102, as illustrated in FIG. 1 or the differential current source circuit 200, as illustrated in FIG. 2. Therefore, reference may be made to the example of FIGS. 1-2 in the following description of the example of FIG. 3. In the example of FIG. 3, the current source circuit 300 includes voltage measurements at respective circuit locations (e.g., nodes) of the current source circuit 300. As illustrated in the example of FIG. 3, respective cross-coupling voltages at 302, 304 in the example of FIG. 3 can have opposite amplitude polarities, such that a voltage across a load (represented as resistor $R_{13}$ in FIG. 3), can be substantially 0V. First and second amplifier circuits (labelled respectively as U1 and U2 in FIG. 3) can be configured to maintain the cross-coupling voltages, such that a load current 306 (e.g., the load current 110, as illustrated in FIG. 1 or the load current 202, as illustrated in FIG. 2) is constant and does not vary with respect to load changes (e.g., impedance changes at the load).

Figure 4:
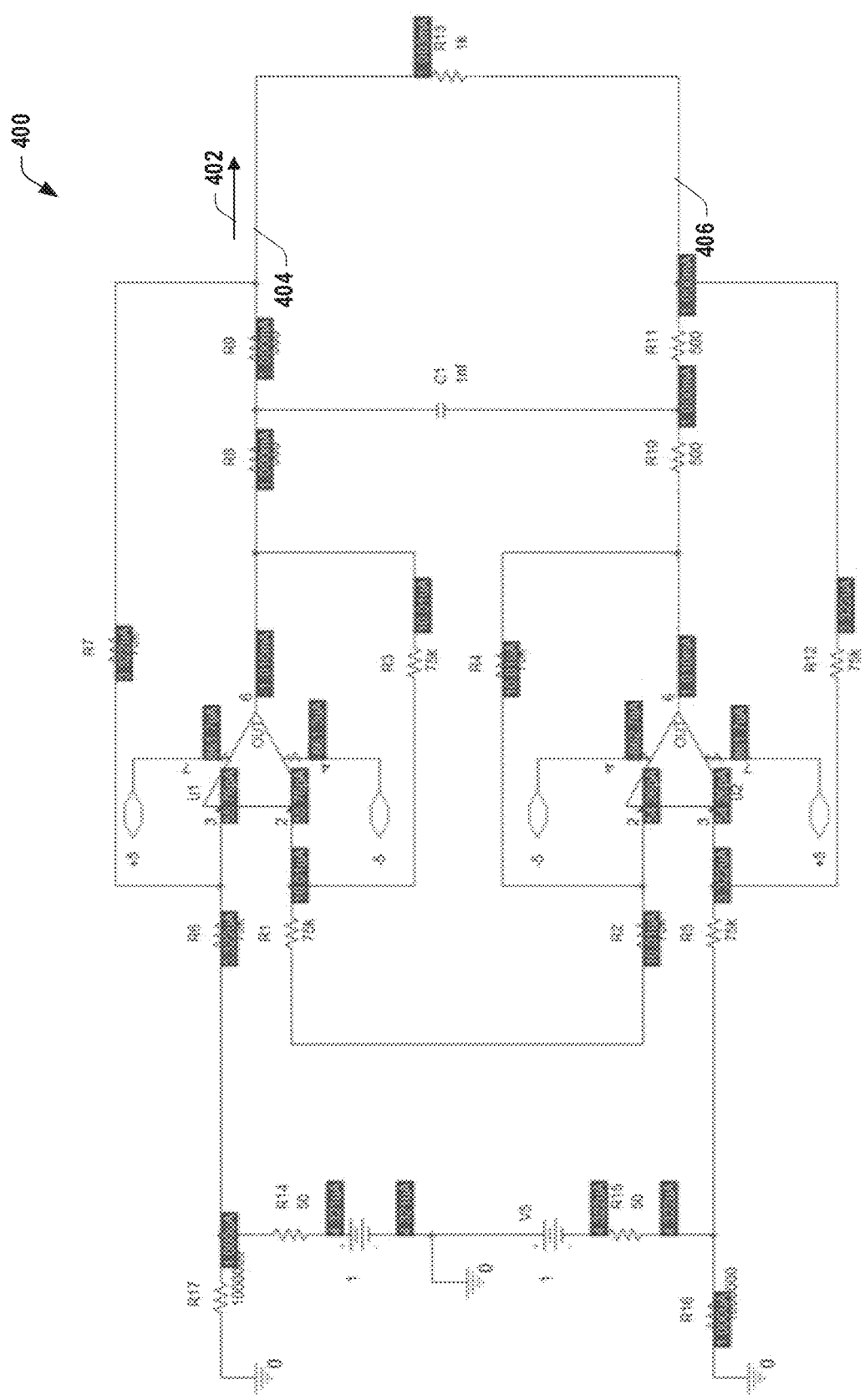
FIG. 4 illustrates a further example of a current source circuit.

FIG. 4 illustrates an example of a current source circuit 400. In some examples, the current source circuit 400 can correspond to the current source 102, as illustrated in FIG. 1 or the differential current source circuit 200, as illustrated in FIG. 1. Therefore, reference may be made to the example of FIGS. 1-2 in the following description of the example of FIG. 4. In the example of FIG. 4, the current source circuit 400 includes current measurements at respective circuit locations (e.g., nodes) of the current source circuit 400. As illustrated in example of FIG. 4, a load (represented as $R_{13}$ in FIG. 4) can be configured to receive a load current 402 along a first load current path 404 and provide the load current 402 along a second load current path 406 back to the current source circuit 400. Thus, the current source circuit 400 can be configured to push the load current 402 to the load and pull the load current 402 from the load. Because the first and second amplifiers (labelled respectively as U1 and U2 in FIG. 4) in the example of FIG. 4 are operating out of phase, the first and second amplifiers act in a push-pull typology with respect to the load to push and pull the load current 402.

The load current 402 flowing through the load can remain constant since the first amplifier references a first set of resistors (labelled as R8 and R9 in FIG. 4) and a second amplifier (labelled as U2 in FIG. 4) references a second set of resistors (labelled as R10 and R11 in FIG. 4). The first and second set of resistors can collectively define a cross-coupling circuit, such as cross-coupling circuit 122, as illustrated in FIG. 1 or the feedback cross-coupling circuit 218, as illustrated in FIG. 2. For example, during a current push, the load current 402 can be based on a first input voltage (labelled as V4 in FIG. 4) and a resistance of the first set of resistors. During a current pull, the load current 402 can be based on a second input voltage (labelled as V5 in FIG. 4) and a resistance of the second set of resistors.

Figure 5:
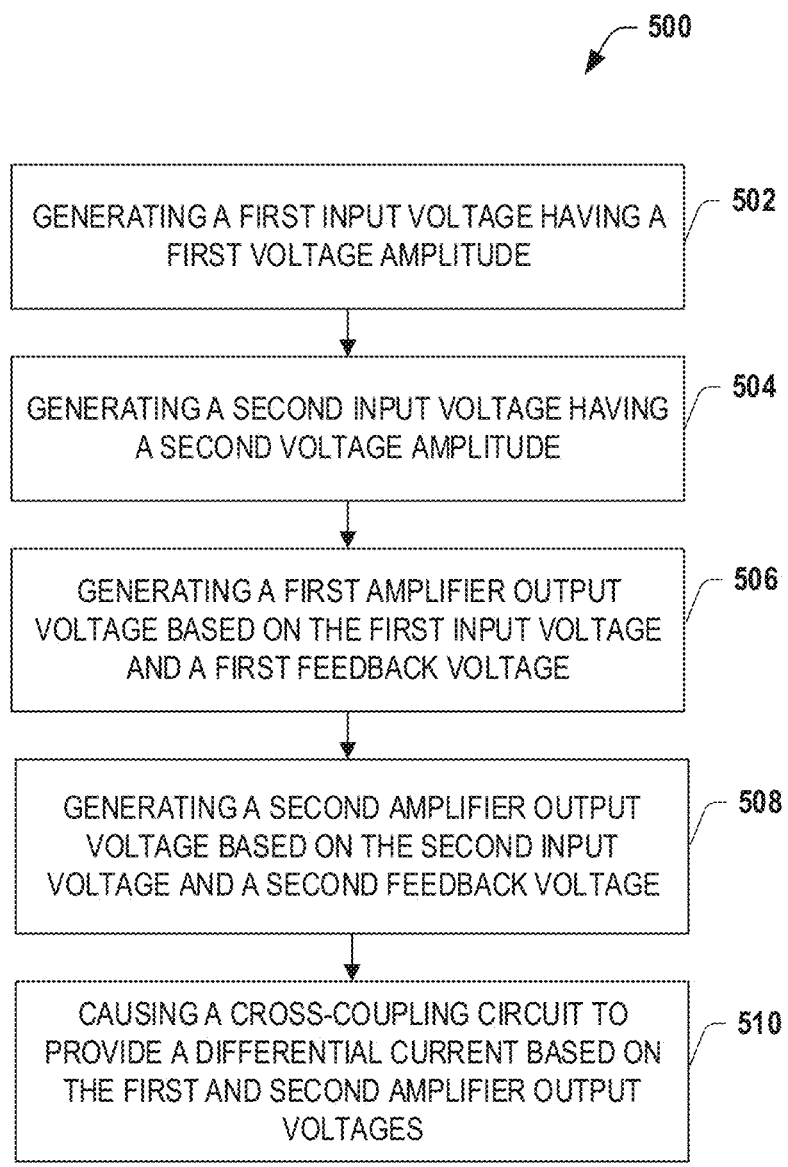
FIG. 5 illustrates an example of a method for generating a differential current.

In view of the foregoing structural and functional features described above, example methods will be better appreciated with references to FIG. 5. While, for purposes of simplicity of explanation, the example method of FIG. 5 is shown and described as executing serially, it is to be understood and appreciated that the example method is not limited by the illustrated order, as some actions could in other examples occur in different orders, multiple times and/or concurrently from that shown and described herein.

FIG. 5 illustrates an example of a method 500 for generating a differential current. The method 500 can be implemented by a current source, such as the current source 102, as illustrated in FIG. 1 or the differential current source circuit 200, as illustrated in FIG. 2. The method 500 can begin at 502, by generating a first input voltage having a first voltage amplitude. The first input voltage can correspond to the first input voltage $V_{IN1}$, as illustrated in FIG. 1 or 2. Thus, the first input voltage can be generated by a voltage source circuit, such as the voltage source circuit 112, as illustrated in FIG. 1 or the voltage source circuit 208, as illustrated in FIG. 2. At 504, generating a second input voltage having a second voltage amplitude that is opposite of the first voltage amplitude. The second input voltage can correspond to the second input voltage $V_{IN2}$, as illustrated in FIG. 1 or 2. Thus, the second input voltage can be generated by a voltage source circuit, such as the voltage source circuit 112, as illustrated in FIG. 1 or the voltage source circuit 208, as illustrated in FIG. 2.

At 506, generating at a first amplifier circuit a first amplifier output voltage based on the first input voltage and a first feedback voltage. The first feedback voltage can be provided based on a portion of the first amplifier output voltage and a portion of a second feedback voltage. The first amplifier circuit can correspond to the first amplifier circuit 114, as illustrated in FIG. 1. Thus, the first amplifier output voltage can correspond to the first amplifier output voltage $V_{AO1}$, as illustrated in FIG. 1. The first and second feedback voltages can respectively correspond to the first and second feedback voltage $V_{F1}$, $V_{F2}$, as illustrated in FIG. 1. At 508, generating at a second amplifier circuit a second amplifier output voltage based on the second input voltage and the second feedback voltage. The second feedback voltage can be generated based on a portion of the second amplifier output voltage and a portion of the first feedback voltage. The second amplifier circuit can correspond to the second amplifier circuit 116, as illustrated in FIG. 1. Thus, the second amplifier output voltage can correspond to the second amplifier output voltage $V_{AO2}$, as illustrated in FIG. 1. At 510, causing a cross-coupling circuit to provide a differential current based on the first and second amplifier output voltages. The cross-coupling circuit can correspond to the cross-coupling circuit 122, as illustrated in FIG. 1 or the feedback cross-coupling circuit 218, as illustrated in FIG. 1. The differential current can correspond to the load current 110, as illustrated in FIG. 1 or the load current 202, as illustrated in FIG. 1.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A current source circuit comprising:
a first amplifier circuit comprising a first amplifier and a first positive feedback circuit, the first amplifier being configured to generate a first amplifier output voltage based on a first amplifier input voltage and a first feedback voltage, the first feedback voltage being generated based on a portion of the first amplifier output voltage and a portion of a second feedback voltage, and the first amplifier input voltage being generated based on a portion of a first output voltage at a first output node, the first positive feedback circuit being coupled to the first output node and a respective input of the first amplifier, and is configured to provide the portion of the first output voltage at the first output node;
a second amplifier circuit comprising a second amplifier and a second positive feedback circuit, the second amplifier configured to generate a second amplifier output voltage based on a second amplifier input voltage and the second feedback voltage, the second feedback voltage being generated based on a portion of the second amplifier output voltage and a portion of the first feedback voltage, and the second amplifier input voltage being generated based on a portion of a second output voltage at a second output node, the second positive feedback circuit being coupled to the second output node and o a respective input of the second amplifier, and is configured to provide the portion of the second output voltage at the second output node;
a cross-coupling circuit comprising a first set of resistors and a second set of resistors, the first set of resistors being configured to establish a first cross-coupling voltage based on the first amplifier output voltage and the first output voltage, and the second set of resistors being configured to establish a second cross-coupling voltage based on the second amplifier output voltage and the second output voltage, the first and second amplifier circuits being configured to maintain the first and second cross-coupling voltage at a given voltage amplitude to provide a constant current.

2. The current source circuit of claim 1, wherein the first and second amplifiers are configured to maintain the first cross-coupling voltage at a positive voltage and the second cross-coupling voltage at a negative voltage that is opposite of the positive voltage.

3. The current source circuit of claim 2, wherein the cross-coupling circuit comprises at least one capacitor to couple the first set of resistors in series with the second set of resistors.

4. The current source circuit of claim 3, further comprising the first output node and the second output node, the cross-coupling circuit being coupled to each of the first and second output nodes and configured to provide the constant current to the first node for a load coupled to both of first and the second nodes.

5. The current source circuit of claim 4, wherein the cross-coupling circuit is configured to provide the first output voltage at the first output node based on the first cross-coupling voltage and the second output voltage at the second output node based on the second cross-coupling voltage.

6. The current source circuit of claim 5, wherein the first output voltage has a positive voltage amplitude and the second output voltage has a negative voltage amplitude, such that a total output voltage across the first and second output nodes is about zero.

7. The current source circuit of claim 6, wherein the first set of resistors comprises a first resistor and a second resistor, the first and second resistors being coupled in series, the second set of resistors comprising a third resistor and a fourth resistor, the third resistor being coupled in series with the fourth resistor, the first and second resistors being coupled in parallel with the third and fourth resistors.

8. The current source circuit of claim 6, wherein the first amplifier circuit further comprises a first negative feedback circuit, the first positive feedback circuit being configured to couple a first input of the first amplifier corresponding to the respective input of the first amplifier to the first output node, the first negative feedback circuit being configured to couple the cross-coupling circuit to a second input of the first amplifier and an output of the first amplifier to the second input, the first negative feedback circuit being configured to provide the portion of the first amplifier output voltage.

9. The current source circuit of claim 8, wherein the second amplifier circuit further comprises a second negative feedback circuit, the second positive feedback circuit being configured to couple a first input of the second amplifier corresponding to the respective input of the second amplifier to the second output node, the second negative feedback circuit being configured to couple the cross-coupling circuit to a second input of the second amplifier and an output of the second amplifier to the second input, the second negative feedback circuit being configured to provide the portion of the second amplifier output voltage.

10. The current source circuit of claim 9, wherein the second input of the first amplifier is coupled to the second input of the second amplifier, such that the first feedback voltage has a positive voltage amplitude and the second feedback voltage has a negative voltage amplitude that is opposite of the positive voltage amplitude of the first feedback voltage.

11. The current source circuit of claim 10, further comprising a first voltage source configured to provide the first input voltage and a second voltage source configured to provide the second input voltage, wherein the first input voltage has a positive voltage amplitude and the second input voltage has a negative voltage amplitude that is opposite of the positive voltage amplitude of the first input voltage, wherein the first amplifier input voltage is further generated based on the first input voltage, and the second amplifier input voltage is further generated based on the second input voltage.

12. A method comprising:
generating a first amplifier input voltage having a first voltage amplitude at a respective input of a first amplifier circuit, wherein the first amplifier input voltage is generated based on a portion of a first output voltage at a first output node, and wherein a first positive feedback circuit is coupled to the first output node and the respective input of the first amplifier circuit, and is configured to provide the portion of the first output voltage at the first output node;
generating a second amplifier input voltage having a second voltage amplitude that is opposite of the first voltage amplitude at a respective input of a second amplifier circuit, wherein the second amplifier input voltage is generated based on a portion of a second output voltage at a second output node, and wherein a second positive feedback circuit is coupled to the second output node and the respective input of the second amplifier circuit, and is configured to provide the portion of the second output voltage at the second output node;

generating at an output of the first amplifier circuit a first amplifier output voltage based on the first amplifier input voltage and a first feedback voltage, the first feedback voltage being provided based on a portion of the first amplifier output voltage and a portion of a second feedback voltage;

generating at an output of the second amplifier circuit a second amplifier output voltage based on the second amplifier input voltage and the second feedback voltage, the second feedback voltage being generated based on a portion of the second amplifier output voltage and a portion of the first feedback voltage;

causing a cross-coupling circuit to provide a differential current based on the first and second amplifier output voltages.

13. The method of claim 12, further comprising:
providing the differential current to a device under test (DUT) to test the DUT, wherein the differential current has a current amplitude in a nano-amperes range.

14. The method of claim 12, wherein causing the cross-coupling circuit to provide the differential current comprises:
establishing a first cross-coupling voltage based on the first amplifier output voltage and the first output voltage;
establishing a second cross-coupling voltage based on the second amplifier output voltage and the second output voltage;
generating the differential current based on the established first and second cross-coupling voltages.

15. The method of claim 14, further comprising:
configuring first and second amplifier circuits to maintain the first and second cross-coupling voltages at a corresponding voltage amplitude to provide the differential current, wherein the first cross-coupling voltage has a first voltage amplitude and the second cross-coupling voltage has a second voltage amplitude that is opposite of the first voltage amplitude of the first cross-coupling voltage.

16. A differential current source circuit comprising:
a first amplifier configured to generate a first amplifier output voltage based on a first amplifier input voltage and a first feedback voltage, the first feedback voltage being generated based on a portion of the first amplifier output voltage and a portion of a second feedback voltage, and the first amplifier input voltage being generated based on a portion of a first output voltage at a first output node;
a first positive feedback circuit coupled to the first output node and a respective input of the first amplifier that is to receive the first amplifier input voltage, the first positive feedback circuit being configured to provide the portion of the first output voltage at the first output node;

a second amplifier configured to generate a second amplifier output voltage based on a second amplifier input voltage and a second feedback voltage, the second feedback voltage being generated based on a portion of the second amplifier output voltage and a portion of the first feedback voltage, and the second amplifier input voltage being generated based on a portion of a second output voltage at a second output node;

a second positive feedback circuit coupled to the second output node and a respective input of the second amplifier that is to receive the second amplifier input voltage, the second positive feedback circuit being configured to provide the portion of the second output voltage at the second output node; and a cross-coupling circuit comprising a first set of resistors and a second set of resistors, the first set of resistors being coupled to the first amplifier and the second set of resistors being coupled to the second amplifier, the first set of resistors being configured to establish a first cross-coupling voltage based on the first amplifier output voltage and the first output voltage, and the second set of resistors being configured to establish a second cross-coupling voltage based on the second amplifier output voltage and the second output voltage, the cross-coupling circuit being configured to a provide a differential current based on the first and second cross-coupling voltages.

17. The differential current source circuit of claim 16, further comprising:
a first feedback circuit configured to provide a portion of the first amplifier output voltage; and
a second feedback circuit configured to provide a portion of the second amplifier output voltage.

18. The differential current source circuit of claim 17, wherein first amplifier and the first feedback circuit correspond to a first amplifier circuit and the second amplifier and the second feedback circuit correspond to a second amplifier circuit, the first and second amplifiers configured to maintain the first and second cross-coupling voltages at opposite voltage amplitudes to provide the differential current.

19. The differential current source circuit of claim 17, further comprising the first output node and the second output node, wherein the first set of resistors are coupled to the first output node to provide the first output voltage having a first voltage amplitude, and the second set of resistors are coupled to the second output node to provide the second output voltage having a second voltage amplitude that is opposite of the first voltage amplitude, such that a total output voltage across the first and second nodes is about equal to zero.

20. The differential current source circuit of claim 19, wherein the differential current is provided to one of the first and the second output nodes for a load coupled to the first and second output nodes, wherein the load floats with respect to the differential current source circuit.

* * * * *